United States Patent
Yoshimine

(10) Patent No.: US 8,080,725 B2
(45) Date of Patent: Dec. 20, 2011

(54) PHOTOVOLTAIC MODULE

(75) Inventor: Yukihiro Yoshimine, Kobe (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 304 days.

(21) Appl. No.: 11/730,092

(22) Filed: Mar. 29, 2007

(65) Prior Publication Data
US 2007/0227585 A1    Oct. 4, 2007

(30) Foreign Application Priority Data

Mar. 30, 2006 (JP) ............................ P2006-094973
Feb. 8, 2007 (JP) ............................ P2007-029663

(51) Int. Cl.
*H02N 6/00* (2006.01)
*H01L 31/042* (2006.01)

(52) U.S. Cl. ..................... 136/251; 136/256
(58) Field of Classification Search ............... 136/251, 136/256
See application file for complete search history.

(56) References Cited

U.S. PATENT DOCUMENTS

| | | | |
|---|---|---|---|
| 5,684,325 A | 11/1997 | Kataoka et al. | |
| 6,204,443 B1 | 3/2001 | Kiso et al. | |
| 2002/0148496 A1 | 10/2002 | Dorner et al. | |
| 2003/0075210 A1 | 4/2003 | Stollwerck et al. | |
| 2004/0216778 A1* | 11/2004 | Ferri et al. ............. | 136/251 |

FOREIGN PATENT DOCUMENTS

| | | | |
|---|---|---|---|
| CN | 1703781 | | 11/2005 |
| JP | 10-341030 | | 12/1998 |
| JP | 2000-183382 | | 6/2000 |
| JP | 2006032618 A | * | 2/2006 |
| WO | 2004019421 | | 3/2004 |

OTHER PUBLICATIONS

Chinese Office Action, English translation included; dated Sep. 25, 2009.
Extended European Search Report from corresponding application, dated Nov. 30, 2009.
Official Action Letter dated Apr. 28, 2010, from corresponding Chinese Case; English translation included.

* cited by examiner

*Primary Examiner* — Emily Le
*Assistant Examiner* — Rebecca Lee
(74) *Attorney, Agent, or Firm* — NDQ&M Watchstone LLP

(57) ABSTRACT

An object of the present invention is to provide a photovoltaic module that achieves a reduction in adverse influence of damage accumulated in a collector electrode provided on a light receiving surface. In the photovoltaic module of the present invention, a first region of a sealing material is in contact with a light receiving surface of a solar cell, and a second region of the sealing material is in contact with a back surface of the solar cell. To achieve the above object, the adhesive force of the first region to the solar cell is smaller than that of the second region to the solar cell.

4 Claims, 8 Drawing Sheets

(SOLAR LIGHT INCIDENT)

LAYERED PRODUCT

PHOTOVOLTAIC MODULE

CROSS REFERENCE TO RELATED APPLICATIONS

This application is based upon and claims the benefit of priority from prior Japanese Patent Application No. 2006-094973, filed on Mar. 30, 2006; and prior Japanese Patent Application No. 2007-029663, filed on Feb. 8, 2007; the entire contents of which are incorporated herein by reference.

BACKGROUND OF THE INVENTION

1. Technical Field of the Invention

The present invention relates to a photovoltaic module that brings improved reliability.

2. Description of the Related Art

A photovoltaic system directly converts the solar light, which is clean and inexhaustibly supplied, into electricity. For this reason, the photovoltaic system is expected as a new energy source.

Here, in a case of a solar cell constituting the photovoltaic system, an output power per unit is in the order of several watts. For this reason, when a photovoltaic system is used as an electric power source for a house, a building or the like, a photovoltaic module including a plurality of solar cells that are electrically connected to one another in series or in parallel is used. With this module, the output power of the photovoltaic system can be increased up to the order of several hundred watts.

To be more precise, as shown in FIG. 1, a photovoltaic module 100 includes a solar cell 101, a light receiving surface side supporting member 102, a back surface side supporting member 103 and a sealing material 104. The light receiving surface side supporting member 102 is provided along a light receiving surface of the solar cell 101. The back surface side supporting member 103 is provided along a back surface of the solar cell 101. The sealing material 104 seals the solar cell 101 between the light receiving surface side supporting member 102 and the back surface side supporting member 103.

In such a photovoltaic module 100, it is generally desirable to maintain a strong adhesion between the sealing material 104, and both of the light receiving surface and the back surface of the solar cell 101 in order to enhance weather resistance and durability. Here, a technique has been proposed for adding a silane coupling agent to the sealing material 104 in order to mitigate a time deterioration in the adhesive property of the sealing material 104 to the solar cell 101 (for example, Japanese Patent Application Laid-open Publication No. 2000-183382).

When the photovoltaic module 100 does not receives the solar light, a stress a on the light receiving surface side of the solar cell 101 is substantially equal to a stress b on the back surface side of the solar cell 101, as shown in FIG. 1.

In contrast, when the photovoltaic module 100 receives the solar light, the temperature on the light receiving surface side of the solar cell 101 becomes higher than the temperature on the back surface side of the solar cell 101. With this phenomenon, the sealing material 104 is thermally expanded more on the light receiving surface side of the solar cell 101 than on the back surface side of the solar cell 101. Since a coefficient of thermal expansion of the sealing material 104 is greater than that of the solar cell 101, the stress a on the light receiving surface side of the solar cell 101 becomes smaller than the stress b on the back surface side thereof, as shown in FIG. 2.

In this way, when the solar cell 101 receives the solar light, the balance between the stress a and the stress b is disrupted. As a result, the solar cell 101 is warped as shown in FIG. 2.

Here, as shown in FIG. 3, in order to collect photogenerated carriers generated in a photovoltaic body 105, the solar cell 101 is provided with a collector electrode 106 on the light receiving surface of the photovoltaic body 105, and a collector electrode 107 on the back surface of the photovoltaic body 105. Since the collector electrode 106 is provided on the light receiving surface of the photovoltaic body 105, it is preferable to form the collector electrode 106 as narrow as possible in order not to block the reception of the solar light.

However, when the solar cell 101 is warped due to the reception of the solar light, a stress is applied to the collector electrode 106. In addition, since the photovoltaic module 100 is used in the open air, and repeats receiving and not receiving the solar light, damage in the collector electrode 106 is accumulated. For this reason, the electron collection performance of the collector electrode 106 is likely to be lowered. Moreover, the thinner the thickness of a substrate constituting the photovoltaic body 105 is, the more heavily the solar cell 101 is warped. Accordingly, heretofore, the thickness of the substrate cannot be made extremely thin.

SUMMARY OF THE INVENTION

The present invention has been made in consideration of the aforementioned problem. An object of the present invention is to provide a photovoltaic module that achieves a reduction in adverse influence of damage accumulated in a collector electrode provided on a light receiving surface side of the photovoltaic module.

In summary, a photovoltaic module according to a first feature of the present invention includes a light receiving surface side supporting member, a sealing material, a solar cell sealed in the sealing material, and a back surface side supporting member, and also has the following features. The sealing material includes a first region that is in contact with a light receiving surface of the solar cell, and a second region that is in contact with a back surface of the solar cell. The adhesive force of the first region to the solar cell is smaller than that of the second region to the solar cell.

According to such a photovoltaic module, the adhesive force of the first region of the sealing material to the solar cell is smaller than that of the second region to the solar cell. In other words, since the first region adheres to the light receiving surface of the solar cell at the small adhesive force, changes in the volume of the first region adversely influence the light receiving surface of the solar cell only to a small extent. For this reason, even though the first region is thermally expanded while receiving the solar light, the adverse influence of the first region on the light receiving surface of the solar cell is small. As a result, a stress applied to the light receiving surface is kept in balance with a stress applied to the back surface. In other words, the first region is displaced from its original position on the light receiving surface of the solar cell while retaining the stress therein, and thereby the balance between the stress applied to the light receiving surface and the stress applied to the back surface remains as it was during manufacturing. This results in a relaxation of a force that acts to warp the solar cell so as to be convex toward the light receiving surface, and a reduction in the stress applied to the light receiving surface side electrode. Thus, it is possible to suppress damage to be accumulated in the collector electrode.

In summary, a photovoltaic module according to a second feature of the present invention includes a light receiving surface side supporting member, a sealing material, a solar cell sealed in the sealing material, and a back surface side supporting member, and also has the following features. The sealing material includes a first region that is in contact with a light receiving surface of the solar cell, and a second region that is in contact with a back surface of the solar cell.

The first region and the second region contain the same resin sealing material, and an additive agent for increasing an adhesive force to the solar cell. Then, the amount of the additive agent contained in the first region is smaller than that contained in the second region.

A third feature of the present invention is summarized in that the additive agent of the second aspect of the present invention is a silane coupling agent.

In summary, a photovoltaic module according to a fourth feature of the present invention includes a light receiving surface side supporting member, a sealing material, a solar cell sealed in the sealing material, and a back surface side supporting member, and also has the following features. The sealing material includes a first region that is in contact with a light receiving surface of the solar cell, and a second region that is in contact with a back surface of the solar cell. The solar cell contains hydroxyl groups in the light receiving surface and the back surface, and the density of functional groups that form covalent bonding or hydrogen bonding with the hydroxyl groups is lower in the first region than that in the second region.

In summary, a photovoltaic module according to a fifth feature of the present invention includes a light receiving surface side supporting member, a sealing material, a solar cell sealed in the sealing material, and a back surface side supporting member, and also has the following features. The sealing material includes a first region that is in contact with a light receiving surface of the solar cell, and a second region that is in contact with a back surface of the solar cell. The back surface of the solar cell is coated with a base coating agent for increasing an adhesive force to the second region.

In summary, a photovoltaic module according to a sixth feature of the present invention includes a light receiving surface side supporting member, a sealing material, a solar cell sealed in the sealing material, and a back surface side supporting member, and also has the following features. The sealing material includes a first region that is in contact with a light receiving surface of the solar cell, and a second region that is in contact with a back surface of the solar cell. Then, the solar cell contains hydroxyl groups in the light receiving surface and the back surface. The density of hydroxyl groups in the back surface of the solar cell is lower than that in the back surface of the solar cell.

In summary, a photovoltaic module according to a seventh feature of the present invention includes a light receiving surface side supporting member, a sealing material, a solar cell sealed in the sealing material, and a back surface side supporting member, and also has the following features. The sealing material includes a first region that is in contact with a light receiving surface of the solar cell, and a second region that is in contact with a back surface of the solar cell. The surface area of the light receiving surface of the solar cell is smaller than that of the back surface of the solar cell.

According to the present invention, it is possible to provide a photovoltaic module that achieves a reduction in adverse influence of damage accumulated in a collector electrode provided on a light receiving surface side, and a method for manufacturing the photovoltaic module.

DETAILED DESCRIPTION OF THE PREFERRED EMBODIMENTS

Figure 1:
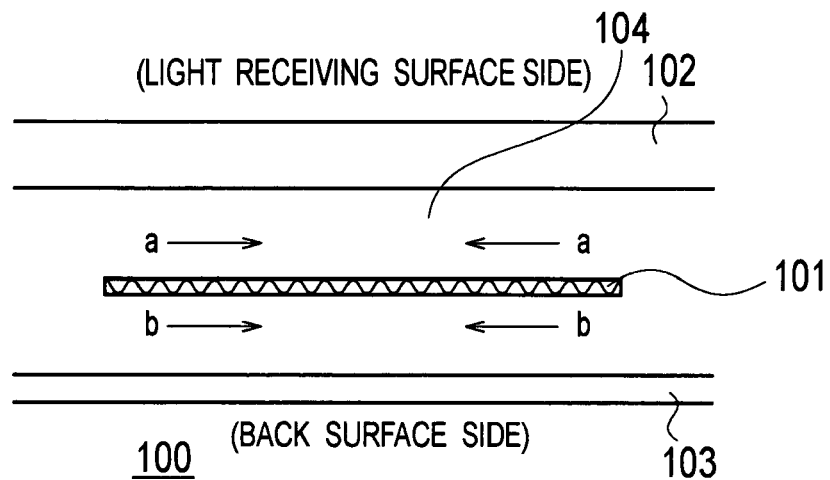
FIG. 1 is a diagram for explaining stresses applied to a conventional solar cell.

Hereinafter, a embodiment of the present invention will be described by using the drawings. In the following description of the drawings, the same or similar reference numerals are given to the same or similar components. It should be noted that the drawings are schematic ones, each dimensional ratio or the like shown in the drawings are different from those of actual ones. For this reason, specific dimensions or the like should be determined with reference to the following description. Moreover, as a matter of course, the drawings include part where there are differences among the drawings in terms of dimensional relationships and ratios.

<Photovoltaic Module 10>

Figure 4A:
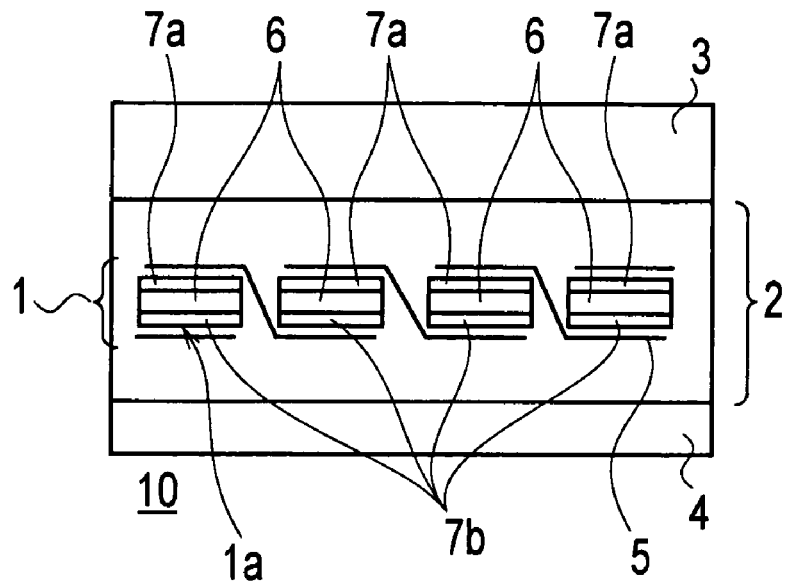
FIGS. 4A and 4B are diagrams for explaining a photovoltaic module according to an embodiment.
Figure 4B:
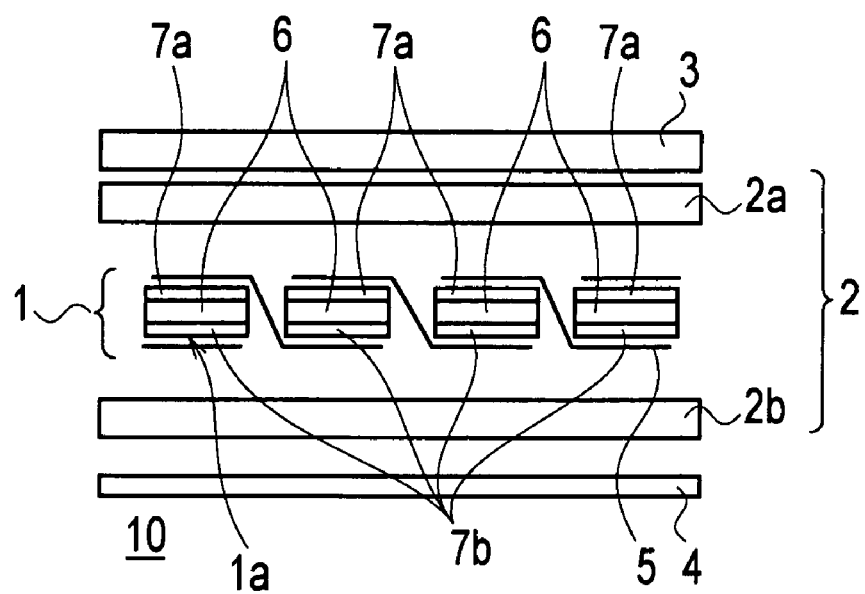

FIGS. 4A and 4B show cross sectional diagrams of a photovoltaic module 10 according to this embodiment. FIG. 4A is a diagram for illustrating a cross sectional structure of the photovoltaic module 10 that has been integrated through a module forming process. FIG. 4B is an exploded diagram for illustrating the photovoltaic module 10 before the module forming process.

The photovoltaic module 10 includes a solar cell string 1, a sealing material 2, a light receiving surface side supporting member 3 and a back surface side supporting member 4.

The solar cell string 1 is formed of a plurality of solar cells 1a which are electrically connected to one another with wiring materials 5 made of copper foil or the like.

The solar cell 1a includes a photovoltaic body 6 and a collector electrode 7.

The photovoltaic body 6 can be formed of a general solar cell material which includes a semiconductor junction such as a pn junction or a pin junction therein, including: a crystal type semiconductor material such as single-crystalline silicon (Si) and poly-crystalline Si; a compound type semiconductor material such as GaAs and CuInSe; a thin-film silicon type material; a organic type material such as dye sensitization type material; or the like.

The collector electrode 7 adheres onto the light receiving surface and the back surface of the photovoltaic body 6, and collects photogenerated carriers generated in the photovoltaic body 6. For this purpose, the collector electrode 7 includes a light receiving surface side electrode 7a and a back surface side electrode 7b.

The light receiving surface side electrode 7a and the back surface side electrode 7b are formed of a conductive material including silver, aluminum, copper, nickel, tin, gold or the like, or alloy of any of these. Note that the collector electrode 7 may have a monolayer structure or a multilayer structure including the conductive material. In addition to the foregoing layer including the conductive material, the electrode may have a layer including a translucent conductive oxide such as $SnO_2$, ITO, IWO or ZnO.

Figure 5A:
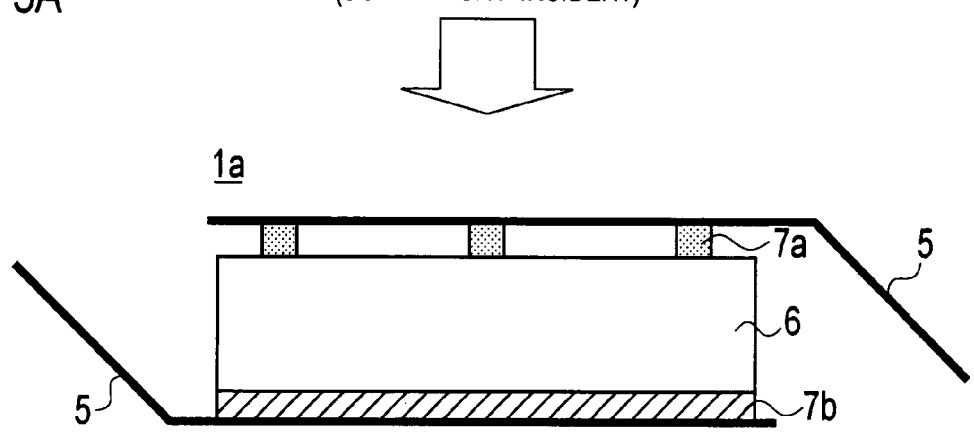
FIGS. 5A and 5B are diagrams for explaining a solar cell according to the embodiment.
Figure 5B:
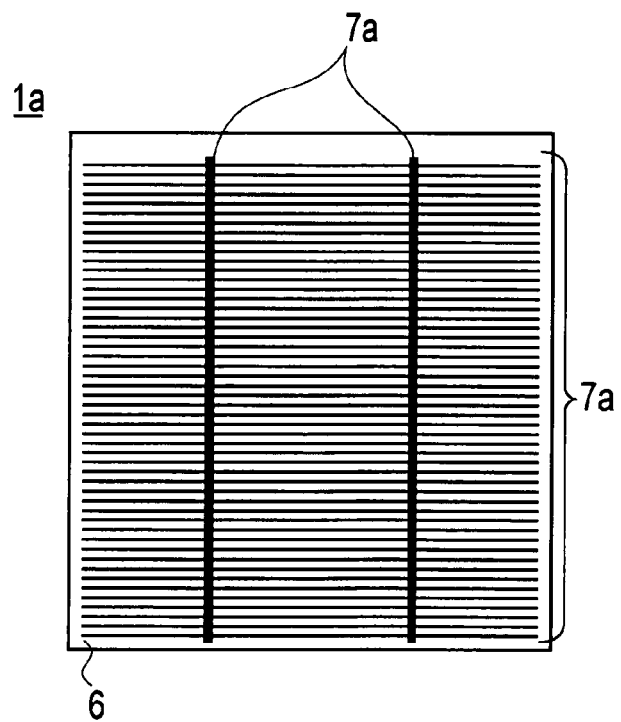

The light receiving surface side electrode 7a is provided so as to occupy an area as small as possible for the purpose of securing a large light receiving area on the light receiving surface of the photovoltaic body 6, that is, for securing the large exposed area on the light receiving surface of the photovoltaic body 6. For example, the light receiving surface side electrode 7a is formed in a comb-like shape or a so-called finger-like shape with the width of the light receiving surface side electrode 7a made narrow, as shown in a cross sectional view (see FIG. 5A) and a top view of the solar cell 1a (see FIG. 5B). On the other hand, the back surface side electrode 7b may be formed in a comb-like shape, or may be formed over an entire area of the back surface of the photovoltaic body 6. In this embodiment, as described above, the adhesion area where the light receiving surface side electrode 7a adheres onto the light receiving surface of the photovoltaic body 6 is smaller than the adhesion area where the back surface side electrode 7b adheres onto the back surface of the photovoltaic body 6.

The sealing material 2 seals the solar cell string 1. Specifically, as shown in FIG. 4B, the light receiving surface of the solar cell 1a is in contact with a first region 2a of the sealing material 2, and the back surface of the solar cell 1a is in contact with a second region 2b of the sealing material 2. The sealing material 2 can be formed of a resin material such as EVA (ethylene vinyl acetate), PVB (polyvinyl butyral), silicone resin, urethane resin, acrylic resin, fluorocarbon-based resin, ionomer resin, silane denatured resin, ethylene-acrylic acid copolymer, ethylene-methacrylic acid copolymer, polyethylene-based resin, polypropylene-based resin, acid-denatured polyolefin-based resin or epoxy-based resin. More than one type of the above resin may be used and compounded to form the sealing material 2. Note that, in a case where the sealing material 2 is made of a thermoplastic resin such as EVA, a silane coupling agent, for instance, is mixed with the thermoplastic resin in order to enhance the adhesion properties.

Here, in this embodiment, the adhesive force of the first region 2a of the sealing material 2 to the solar cell 1a is smaller than that of the second region 2b of the sealing material 2 to the solar cell 1a. Such a structure of the sealing material 2 will be described later in detail, since it relates to a feature of the present invention.

The light receiving surface side supporting member 3 is joined to the light receiving surface side of the solar cell 1a on contact with the first region 2a of the sealing material 2 interposed in between. The light receiving surface side supporting member 3 may be formed of a material such as a glass plate or a plastic plate. The material serves as a protective member that is hard and less likely to be deformed, and allows great part of light with a wavelength which the solar cell 1a can absorb to pass therethrough. The light receiving surface side supporting member 3 is formed of a glass plate of the thickness of 1 mm to 10 mm, for example.

The back surface side supporting member 4 is joined to the back surface of the solar cell 1a on contact with the second region 2b of the sealing material 2 interposed in between. The back surface side supporting member 4 can be formed of a relatively soft film-shaped material to achieve the light weight of the entire module. As the material for the back surface side supporting member 4, used is a resin film such as a PET (polyethylene terephthalate) film, a fluorine resin film or the like; a resin film formed of a vapor-deposited film of metal oxide such as silica or alumina; a metal film such as aluminum foil; or a lamination film including some of these films.

<Method for Manufacturing the Photovoltaic Module 10>

Figure 7:
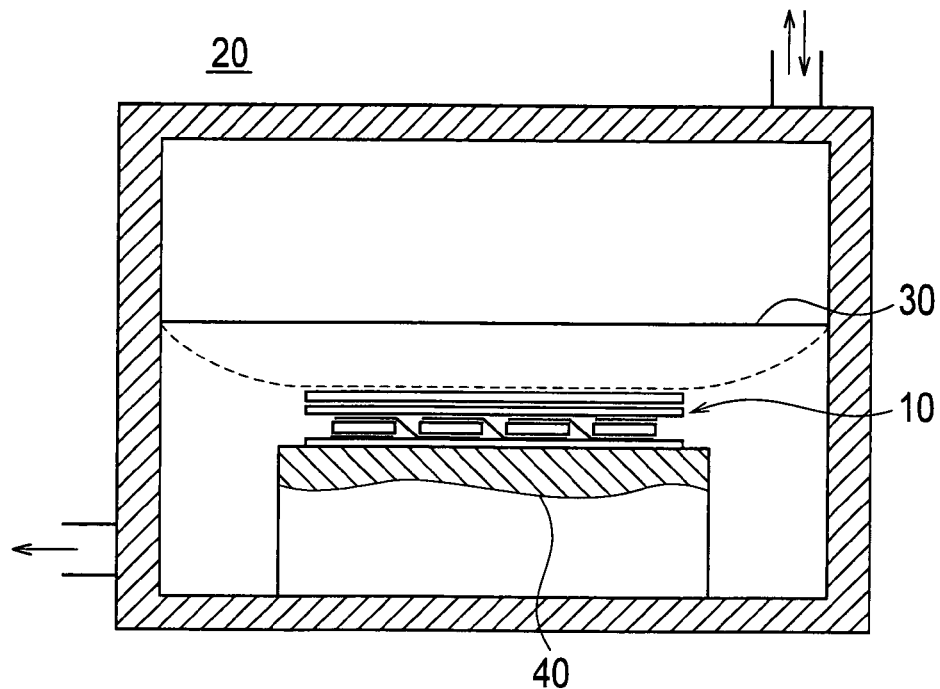
FIG. 7 is a diagram for explaining a vacuum lamination apparatus used in a laminating process.
Figure 8:
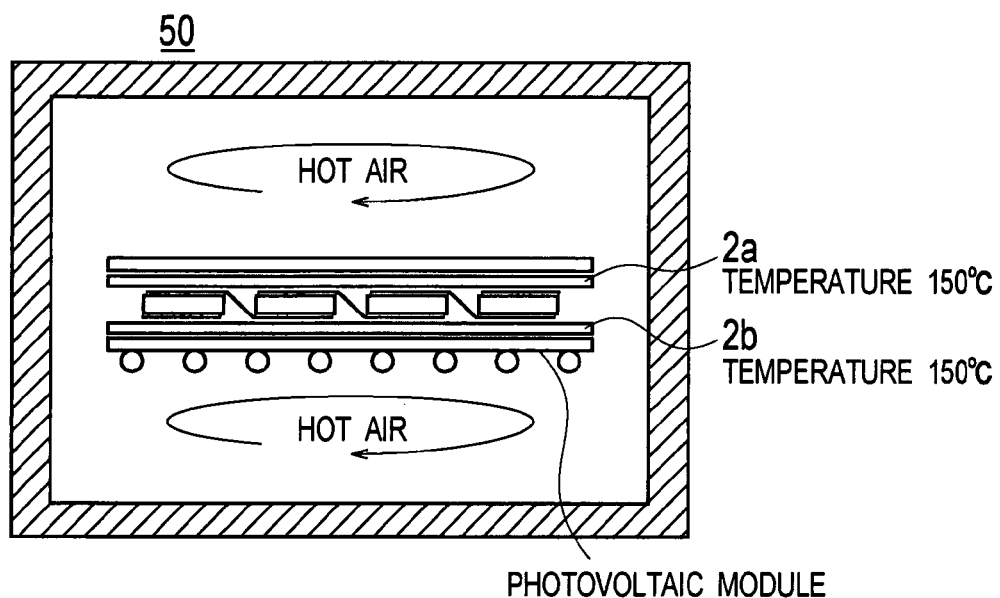
FIG. 8 is a diagram for explaining a heater used in a curing process.

By using FIGS. 6 to 8, descriptions will be given of a method for manufacturing the photovoltaic module 10 according to this embodiment.

Figure 6:
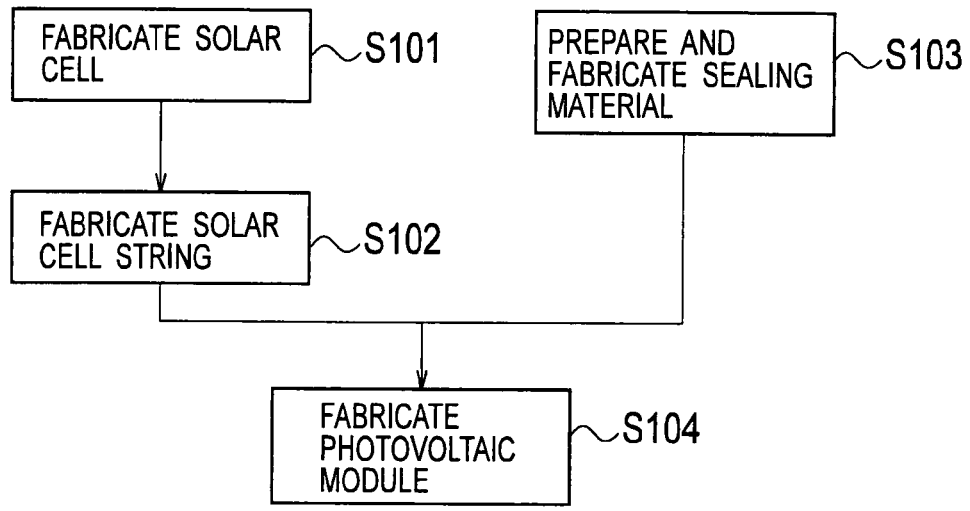
FIG. 6 is a flowchart for explaining a method for manufacturing the photovoltaic module according to the embodiment.

FIG. 6 is a flowchart showing an outline of the manufacturing process of the photovoltaic module 10 according to this embodiment.

In step 101, the solar cell 1a is formed. Firstly, surfaces of an n-type single-crystalline silicon substrate are cleaned, and thereby impurities on surfaces are removed therefrom. Secondly, an i-type amorphous silicon layer and a p-type amorphous silicon layers are sequentially stacked on the light receiving surface of the n-type single-crystalline silicon substrate, by using a vapor deposition method such as an RF plasma CVD method or a Cat-CVD method. Similarly, an i-type amorphous silicon layer and an n-type amorphous silicon layer are sequentially stacked on the back surface of the n-type single-crystalline silicon substrate. In this manner, the photovoltaic body 6 is formed. Thirdly, by using a magnetron sputtering method, ITO films are formed on the light receiving surface of the p-type amorphous silicon layer, and on the back surface of the n-type amorphous silicon layer. Fourthly, by using print processes such as screen print process or offset print process, a conductive material such as an epoxy-based thermoset-type silver paste is disposed in a predetermined pattern on the light receiving surface of the ITO film. Similarly, an epoxy-based thermoset-type silver paste is disposed in a predetermined pattern on the back surface of the ITO film. In this way, the light receiving surface side electrode 7a and the back surface side electrode 7b are integrally formed on the photovoltaic body 6. Note that, in this embodiment, the light receiving surface side electrode 7a is formed in a comb-like shape, and that the back surface side electrode 7b is provided over the entire back surface of the photovoltaic body 6. As such, the solar cell 1a is produced.

Next, in step 102, the solar cell string 1 is formed. To be more precise, the wiring material 5 is connected to both the light receiving surface side electrode 7a of a first solar cell 1a, and the back surface side electrode 7b of a second solar cell 1a that is next to the first solar cell 1a, while being pressed and heated. In this way, the first solar cell 1a is electrically connected to the second solar cell 1a, and thus the solar cell string 1 is produced.

Here, in step 103 that is preformed in parallel with or before steps 101 and 102, the sealing material 2 is produced and thus prepared.

Next, in step 104, the photovoltaic module 10 is produced. This module forming processing includes the following two processes.

Laminating process: In this process, internal materials are made to temporarily adhere to each other by using a vacuum lamination apparatus 20 shown in FIG. 7 while an air bubble is prevented from forming between each pair of the internal materials. The interior of the vacuum lamination apparatus 20 is divided into two chambers, that is, upper and lower chambers with a diaphragm 30, and thereby it is possible to decompress each of the chambers independently. Firstly, the light receiving surface side supporting member 3, the light receiving side sealing material sheet (first region) 2a, the solar cell string 1, the back surface side sealing material sheet (second region) 2*b* and the back surface side supporting member 4 are mounted in this order on a mounting table 40 which can be heated. Secondly, the air is discharged from each of the upper and lower chambers, while the mounting table 40 is being heated up to a predetermined temperature. In this way, the formation of an air bubble is prevented. Thirdly, the photovoltaic module 10 is pressed with the diaphragm 30 for a predetermined duration by causing the air to flow into the upper chamber. Hence, the temporary adhesion is completed.

Curing process: In this process, the sealing material 2 is cured by using a heater 50 shown in FIG. 8. The heater 50 is capable of uniformly heating the photovoltaic module 10 by high-temperature blast thereto. Firstly, the photovoltaic module 10 including the temporarily adhering internal materials is placed inside the heater 50. Then, the photovoltaic module 10 is heated at a predetermined temperature for a predetermined duration. Through this process, the sealing material 2 is completely cured.

As described above, the photovoltaic module 10 according to this embodiment is manufactured.

<About Adhesive Force of Sealing Material 2 to Solar Cell 1*a*>

This embodiment has a feature that the adhesive force of the first region 2*a* of the sealing material 2 to the solar cell 1*a* is smaller than that of the second region 2*b* of the sealing material 2 to the solar cell 1*a*. In order to make the adhesive force between the first region 2*a* and the solar cell 1*a* smaller than that between the second region 2*b* and the solar cell 1*a*, the following methods can be used in the foregoing manufacturing steps of the photovoltaic module 10.

(1) Use of Anchoring Effect

For the purpose of making the surface area of the light receiving surface of the solar cell 1*a* smaller than that of the back surface thereof, concave-convex configuration is formed on the back surface. The concave-convex configuration makes the anchoring effect occurring at an interface between the first region 2*a* and the solar cell 1*a* smaller than that occurring at an interface between the second region 2*b* and the solar cell 1*a*. Accordingly, the adhesive force between the first region 2*a* and the solar cell 1*a* can be made smaller than that between the second region 2*b* and the solar cell 1*a*.

Specifically, in the aforementioned step 101, the surface of the n-type single-crystalline silicon substrate is processed by reactive ion etching (RIE) or the like using an etching gas such as $ClF_3$. When the solar cell 1*a* is formed by using the n-type single-crystalline silicon substrate thus processed, the surface area in the light receiving surface of the solar cell 1*a* can be made smaller than that in the back surface thereof.

(2) Surface Treatment for Increasing Adhesive Force

A surface treatment for increasing the adhesive force between the second region 2*b* and the solar cell 1*a* is performed on the back surface of the solar cell 1*a*. On the other hand, such a surface treatment is not performed on the light receiving surface. In this way, the adhesive force between the first region 2*a* and the solar cell 1*a* can be made smaller than that between the second region 2*b* and the solar cell 1*a*.

To be more precise, any one of the following surface treatments is performed on the back surface of the solar cell 1*a* formed in the aforementioned step 101.

Plasma treatment: A gas mainly containing an argon gas or an oxygen gas is ionized to generate plasma in the air, and then hydroxyl groups are formed on the back surface of the solar cell 1*a*, by spraying the plasma thus generated.

Corona discharge treatment: Corona discharge is caused to occur near the back surface of the solar cell 1*a*, and thereby the back surface becomes in an activated radical state. This facilitates the hydroxyl groups to be formed on the back surface.

UV irradiation treatment: The back surface of the solar cell 1*a* is irradiated with ultra violet rays (the wavelength of 200 nm to 300 nm) from a high-pressure mercury lamp, a metal halide lamp or the like. This irradiation facilitates the hydroxyl groups to be formed on the back surface by removing contaminated matters such as organic matters, and concurrently by activating the back surface.

(3) Coating of Base Coating Agent for Increasing Adhesive Force

The back surface of the solar cell 1*a* is coated with a base coating agent for increasing the adhesive force, while the light receiving surface is not coated with the base coating agent. In this manner, the adhesive force between the first region 2*a* and the solar cell 1*a* can be made smaller than that between the second region 2*b* and the solar cell 1*a*.

Specifically, a primer treatment is performed on the back surface of each solar cell 1*a*, which constitutes the solar cell string 1, and which is produced in the aforementioned step 102, by using a spraying method with a base coating agent for increasing the adhesive force between the back surface and the second region 2*b*. As such a base coating agent, epoxy resin, phenol compound, silane compound or the like can be used. Note that such a primer treatment may be performed on the solar cell 1*a* formed in the aforementioned step 101. In this case, if a base coating agent has isolation properties, a portion in the back surface side electrode 7*b* to which the wiring material 5 is connected is masked.

(4) Use of Sealing Material Containing Additive Agent for Increasing Adhesive Force In the aforementioned step 103, as the sealing material used for the second region 2*b*, prepared is a sealing material containing an additive agent for increasing the adhesive force between the second region 2*b* and the solar cell 1*a*. On the other hand, as the sealing material used for the first region 2*a*, prepared is a sealing material containing the smaller amount of the additive agent, or containing no additive agent. By using such sealing materials, the adhesive force between the first region 2*a* and the solar cell 1*a* can be made smaller than that between the second region 2*b* and the solar cell 1*a*.

Specifically, a material for the sealing material and the foregoing additive agent are melted inside a cylinder barrel heating furnace, and then are extruded from a pipe sleeve of the furnace. Thereby, the foregoing sealing material containing the additive agent is formed in a sheet shape.

(5) Use of Sealing Material Prepared by Adjusting Density of Functional Groups Forming Covalent Bonding with Hydroxyl Groups In the aforementioned step 103, as the sealing material used for the second region 2*b*, prepared is a sealing material having the high density of functional groups that forms covalent bonding with hydroxyl groups existing on the surfaces of the solar cell 1*a*. On the other hand, as the sealing material used for the first region 2*a*, prepared is a sealing material having the low density of the functional groups. When such sealing materials are used, the densities of side chain and principal chain that form covalent bonding and hydrogen bonding with inorganic material are higher in the second region 2*b* than those in the first region 2*a*. Accordingly, by using such sealing materials, the adhesive force between the first region 2*a* and the solar cell 1*a* can be made smaller than that between the second region 2*b* and the solar cell 1*a*.

Specifically, such sealing materials can be formed by using any of the following methods such as: a method for introducing silanol groups into a silane coupling agent by using a silanol condensation catalyst, a grafting reaction catalyst or the like; a method for bonding, through chemical reaction, a silane coupling agent with an organic resin containing organic functional groups capable of chemically reacting with organic functional groups of the silane coupling agent; or a method for causing a silane coupling agent to react with side chain of a resin capable of forming copolymer with the silane coupling agent.

Effect

According to this embodiment, by applying such a structure to a photovoltaic module, it is possible to provide the photovoltaic module that brings improved reliability by suppressing a property deterioration after long-time use, which is attributable to a difference in the way that the light receiving surface and the back surface of the photovoltaic module are subjected to the solar light. The reason for achieving the suppression will be described in detail below.

Table 1 is a property table showing the linear expansion coefficients of main materials constituting a photovoltaic module. As the sealing material, shown is the value of EVA resin, which is a typically used material. As the solar cell, shown is the value of silicon, which is a generally used material. In addition, as the back surface side supporting member, shown is the value of a PET film.

TABLE 1

| THERMAL EXPANSION COEFFICIENTS OF MAIN MATERIALS FOR PHOTOVOLTAIC MODULE (UNIT: ppm/° C.) | |
| --- | --- |
| SEALING MATERIAL | ~400 |
| | (TYPICAL EXAMPLE) |
| PET | ~70 |
| | (TYPICAL EXAMPLE) |
| COPPER | ~17 |
| GLASS | ~5 |
| SILICON WAFER | ~3 |

As shown in Table 1, the linear expansion coefficients have a relationship of the sealing material>the PET film>copper>glass≈the silicon. Moreover, a difference between the linear expansion coefficients of the sealing material and the silicon is the largest among those between any pair of the components constituting the photovoltaic module.

Accordingly, in terms of the contraction degrees of the components that have been thermally expanded in the module forming processing, the sealing material with the largest linear expansion coefficient has the largest contraction degree, and the solar cell formed of a silicon material with the smallest linear expansion coefficient has the smallest contraction degree.

Figure 2:
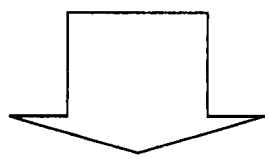
FIG. 2 is a diagram for explaining the stresses applied to the conventional solar cell.
Figure 2:
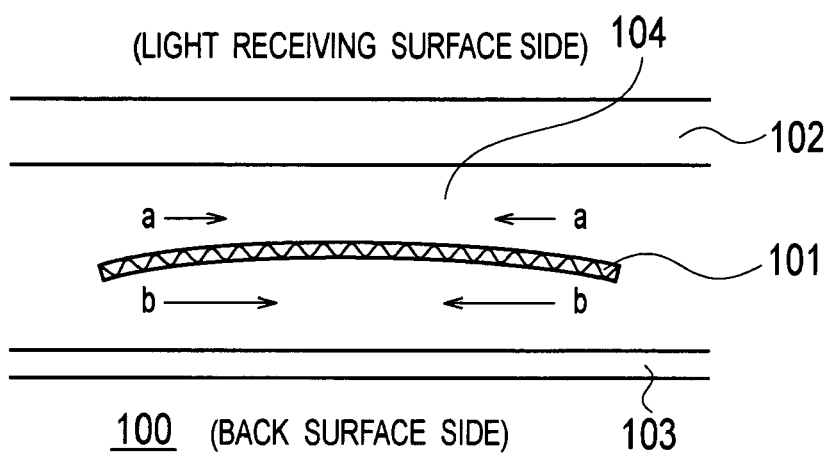
Figure 3:
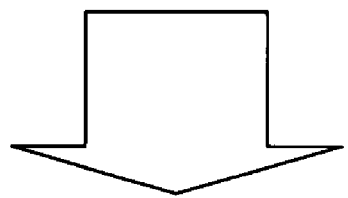
FIG. 3 is a diagram for explaining the stresses applied to the conventional solar cell.
Figure 3:
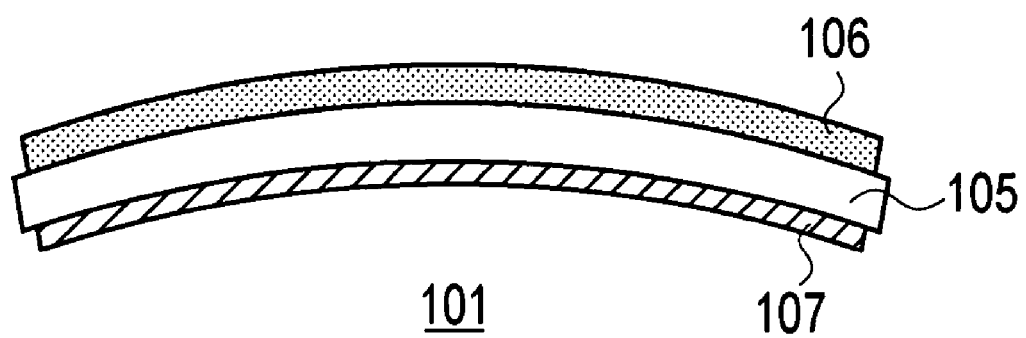

When the conventional photovoltaic module 100 is under manufacturing processing, the stress a applied to the light receiving surface of the solar cell 101 is substantially equal to the stress b applied to the back surface of the solar cell 101, as shown in FIG. 1. However, when the conventional photovoltaic module 100 is receiving the solar light, the balance between the stress a and the stress b is disrupted due to softening and expansion of the sealing material on the light receiving surface side of the solar cell 101, as shown in FIGS. 2 and 3, and this causes the solar cell 101 to be warped. As a result, damage is accumulated in the collector electrode 106, and the reliability of the photovoltaic module 100 is lowered. Incidentally, the thinner the thickness of a silicon wafer becomes, the more frequently, the above-described deterioration of the power of the photovoltaic module happens.

In contrast to this, in a case of the photovoltaic module 10 according to this embodiment, the adhesive force of the first region 2a of the sealing material 2 to the solar cell 1a is smaller than that of the second region 2b of the sealing material 2 to the solar cell 1a. Accordingly, since the first region 2a adheres to the light receiving surface of the solar cell 1a with the small adhesive force, changes of the volume in the first region 2a has a low impact to the light receiving surface of the solar cell 1a. For this reason, even though the first region 2a is softened and expanded while receiving the solar light, the first region 2a has a low impact to the light receiving surface of the solar cell 1a, and thereby the stress a applied to the light receiving surface and the stress b applied to the back surface are kept in balance. In other words, the first region 2a is displaced from its original position on the light receiving surface of the solar cell 1a while retaining the internal stress a, and thereby the balance between the stress a applied to the light receiving surface, and the stress b applied to the back surface remains as it was during manufacturing. This results in a relaxation of a force that acts to warp the solar cell 1a so as to be convex toward the light receiving surface, and a reduction in the stress applied to the light receiving surface side electrode 7a. Thus, it is possible to suppress an increase in the contact resistance of the collector electrode, and a removal of the collector electrode.

Figure 10A:
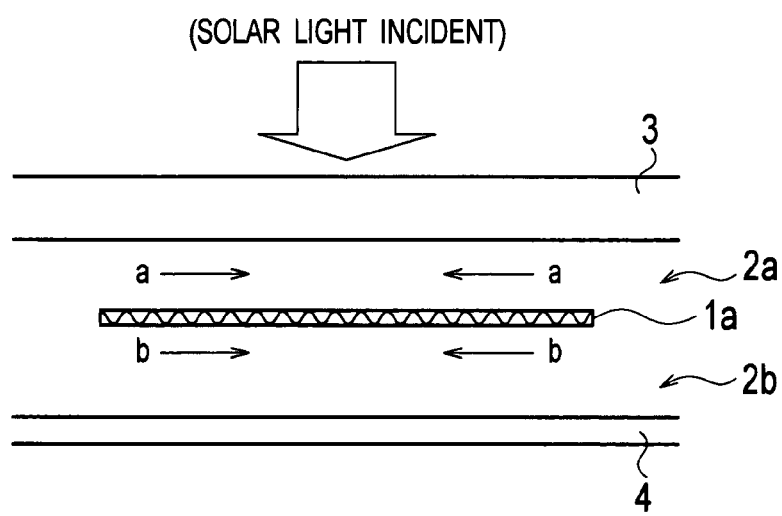
FIGS. 10A and 10B is a diagram for explaining stresses applied to the solar cell according to the embodiments.
Figure 10B:
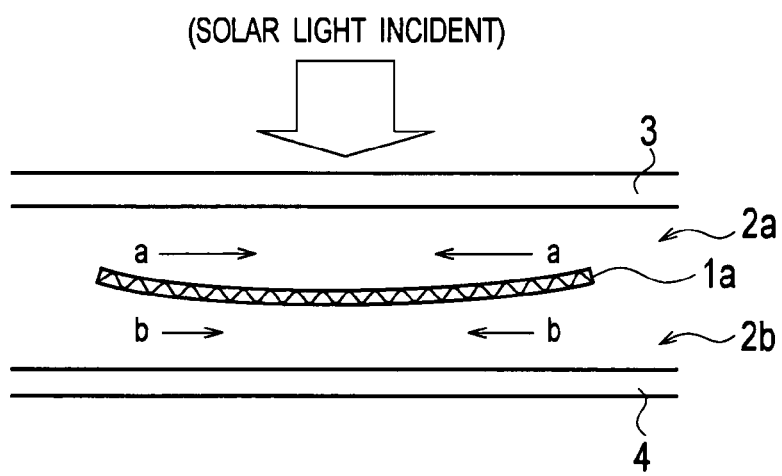

To be more precise, in the case of the photovoltaic module 10, even when the photovoltaic module 10 receives the solar light as shown in FIGS. 10A and 10B, the stress a applied to the light receiving surface of the solar cell 1a and the stress b applied to the back surface of the solar cell 1a are maintained equally, and thereby kept in balance (see FIG. 10A). In addition, when the second region 2b is expanded due to the reception of the solar light, the back surface of the solar cell 1a may be convex to the back surface side (see FIG. 10B). In this case, the adhesive force of the back surface side electrode 7b to the photovoltaic body 6 can be increased by enlarging the adhesion area of the back surface side electrode 7b thereto in contrast to the light receiving surface side electrode 7a. Accordingly, even though the solar cell 1a is warped so as to be convex toward the back surface side, as shown in FIG. 10B, damage to the back surface side electrode 7b is small.

As described above, according to the photovoltaic module 10 of this embodiment, it is possible to provide a photovoltaic module that allows the reliability to be improved by suppressing the damage accumulated in the collector electrode provided on the light receiving surface side, and the method for manufacturing such a photovoltaic module.

Other Embodiments

Although the present invention has been described by using the foregoing embodiment, it should not be understood that the descriptions and the drawings constituting part of this disclosure limits the present invention. From this disclosure, it is obvious to one skilled in the art that alternative embodiments, examples and applied techniques can be made.

For example, although the back surface side electrode 7b is made to adhere to the entire back surface of the photovoltaic body 6 in the foregoing embodiment, the back surface side electrode 7b may adhere to the photovoltaic body 6 so as to expose a part of the photovoltaic body 6, or the back surface side electrode 7b may be formed in a comb-like shape similar to that of the light receiving surface side electrode 7a.

Figure 9:
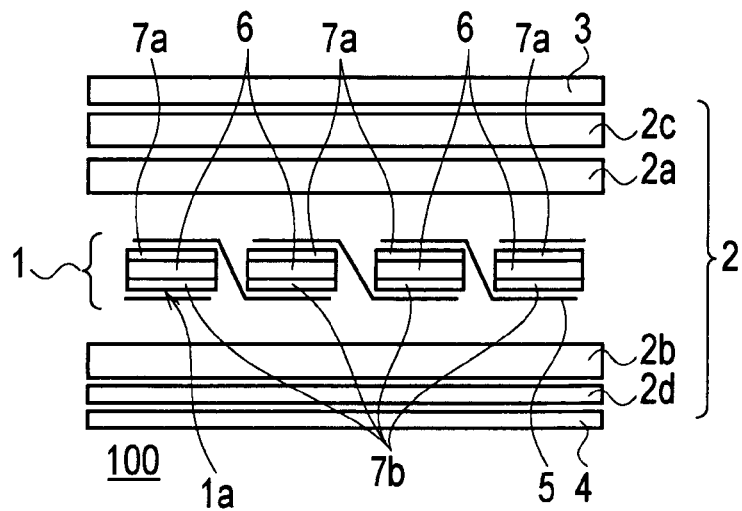
FIG. 9 is a diagram for explaining a photovoltaic module according to another embodiment.

Moreover, in the foregoing embodiment, each of the sealing materials on the light receiving surface side and the back surface side of the solar cell has a single layer structure. However, the structure of each of the sealing materials is not limited to this. Any one of the sealing materials on the light receiving surface side and the back surface side may have a structure including two layers or more. Alternatively, both of the sealing materials on the light receiving surface side and the back surface side have structures each including two layers or more. FIG. 9 is an exploded cross sectional view of a photovoltaic module 10 further including a third region 2c on the light receiving surface of a first region 2a, and a fourth region 2d on the back surface of a second region 2b. In the photovoltaic module 10 shown in FIG. 9, the adhesive force between the first region 2a and a solar cell 1a is smaller than that between the second region 2b and the solar cell 1a. In addition, as a sealing material for forming the third region and the fourth region, it is possible to select any one of or a combination of resin materials such as the EVA and the PVB. In this case, the same effect as in the foregoing embodiment can be produced.

As such, needless to say, the present invention includes various embodiments not described in this disclosure. Accordingly, the technical scope of the present invention should be limited only by the scope of the invention as defined by the appended claims appropriate for the foregoing description.

Examples

Hereinafter, the photovoltaic module of the present invention will be described specifically by taking examples. The present invention is not limited to the below-described examples, and any appropriate modification can be made as long as the spirit and scope of the invention are not changed.
<Relationship Between Additive Agent for Increasing Adhesive Force, and Adhesive Force>

In the first place, a relationship between an additive agent for increasing an adhesive force, and the adhesive force was examined. An EVA resin was used as the sealing material, and vinyltrichlorosilane (silane coupling agent) was used as the additive agent for increasing the adhesive force.

The used EVA resin consists of ethylene vinyl:vinyl acetate=7:3 (wt % ratio); and additionally contains dimethylhexane (2 wt %; a ratio to the EVA resin) as a crosslinker, triallyl-isocyanurate (3 wt %; a ration to the EVA resin) as an auxiliary crosslinking agent, and hydroquinone (1 wt %; a ratio to the EVA resin) as a stabilizer. The EVA resin was formed in a sheet shape of the thickness of 0.6 mm.

A silane coupling agent was also added together with these resins to the EVA resin. By using the different loadings of the silane coupling agent of 0.5 wt %, 2 wt % and 5 wt %, a sample EVA-1, a sample EVA-2 and a sample EVA-3 were produced, respectively. Then, the adhesive forces of the sample EVAs 1 to 3 were evaluated in the following way.

Firstly, an ITO film of the thickness of approximately 1000 Å was formed by sputtering on a glass plate of 10 cm square and about 4 mm thick. Then, this glass plate was placed on a mounting table of a lamination apparatus with the ITO film facing upward. Any one of the foregoing EVA films 1 to 3, and a PET film of about 188 μm thick were placed in this order on the ITO film, and these materials were integrated through the lamination process.

Subsequently, the EVA film in this layered product was made a cut in a 5 mm wide and 5 cm long rectangular matrix from the PET film side, up to the interface between the EVA film and the ITO film. Then, cut edge portions of the PET film and the EVA film were concurrently pulled upwardly, and the tension strength of the EVA film was measured when it peeled off from the ITO film.

Figure 11:
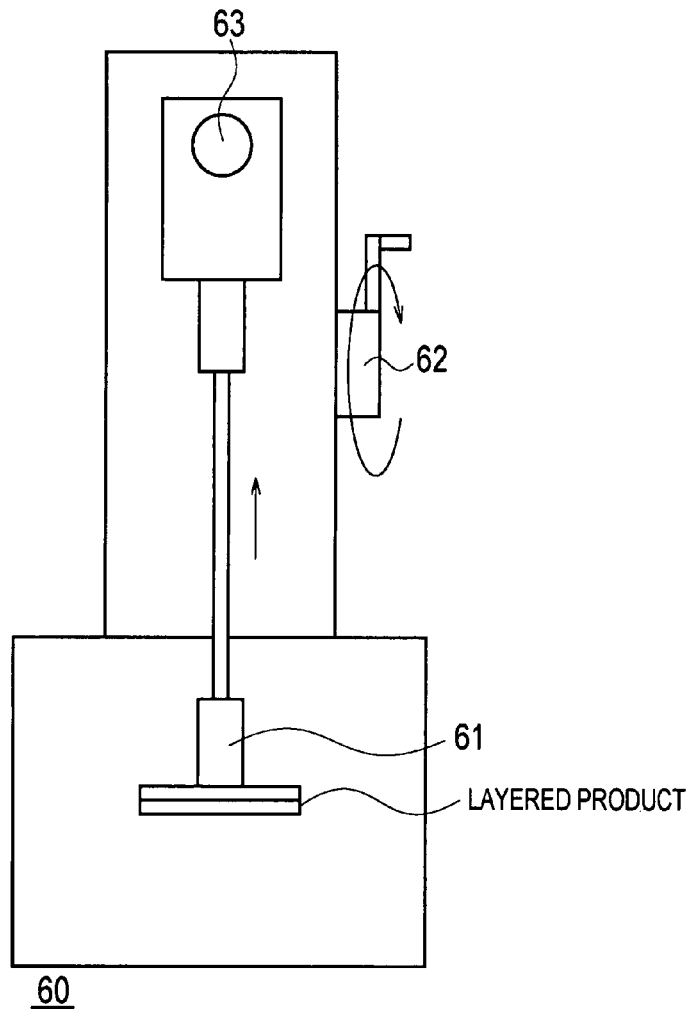
FIG. 11 is a diagram for explaining a tension strength measuring apparatus.

The tension strength at which the EVA film peeled off from the ITO film was measured by vertically upwardly pulling the cut edge portions of the EVA film and the PET film with a peel strength measuring apparatus 60 shown in FIG. 11. Specifically, the above-mentioned layered product was fixed on a sample table (not illustrated) of the peel strength measuring apparatus 60 with the glass plate facing downward, and a clip 61 pinched the PET film and the EVA film in the layered product (not illustrated). Thereafter, the clip 61 was pulled upwardly by rotating a handle 62 of the peel strength measuring apparatus 60, and a value of a peel strength was displayed in a gauge 63 of the peel strength measuring apparatus 60. The adhesive force was determined by measuring the maximum value of the displayed peel strength.

Table 2 shows the examination result obtained when each of the sample EVA-1, the sample EVA-2 and the sample EVA-3 was used.

TABLE 2

ADHESIVE STRENGTH BETWEEN EVA RESIN AND ITO/GLASS SUBSTRATE

| TYPE | AMOUNT OF SILANE COUPLING AGENT(wt %) | ADHESIVE STRENGTH(g) |
| --- | --- | --- |
| EVA-1 | 0.5 | 150 |
| EVA-2 | 2.0 | 250 |
| EVA-3 | 5.0 | 350 |

As shown in Table 2, it was confirmed that the adhesive force increased with an increase of the amount of the silane coupling agent.

Manufacturing Example and Comparative Example

In the second place, a photovoltaic module was manufactured by using the sample EVA-1 and the sample EVA-3 among the above sample EVAs. Specifically, the photovoltaic module of this example was manufactured by using the EVA-1 having the adhesive force of 150 g for a sealing material on the light receiving surface side of a solar cell, and by using the EVA-3 having the adhesive force of 350 g for a sealing material on the back surface side of the solar cell.

In addition, a photovoltaic module was manufactured as a comparative example 1 by using the EVA-3 for sealing materials on both light receiving surface side and back surface side of a solar cell. Furthermore, a photovoltaic module was manufactured as a comparative example 2 by using the EVA-3 for a sealing material on the light receiving surface side of a solar cell, and by using the EVA-1 for a sealing material on the back surface side of the solar cell. Note that the solar cell was manufactured by using a solar cell of the HIT (registered trademark) structure that has a pn junction consisting of an n-type single-crystalline silicon layer, and a p-type amorphous silicon layer with an i-type amorphous silicon layer interposed between the n-type and p-type silicon layers.

<Temperature Cycle Test>

Each of the photovoltaic modules of the above-described example and comparative examples 1 and 2 was examined by performing the below-described temperature cycle test with a temperature-controlled bath, and the powers of the photovoltaic module before and after the temperature cycle test were compared.

FIG. 3 shows the result of a power ratio (posttest module property/pretest module property). The power ratio shown in FIG. 3 is a ratio of power outputted from the module after the temperature cycle test, to power outputted from the module before the test (a ratio between the pretest and posttest maximum values of the power outputted from the module).

Figure 12:
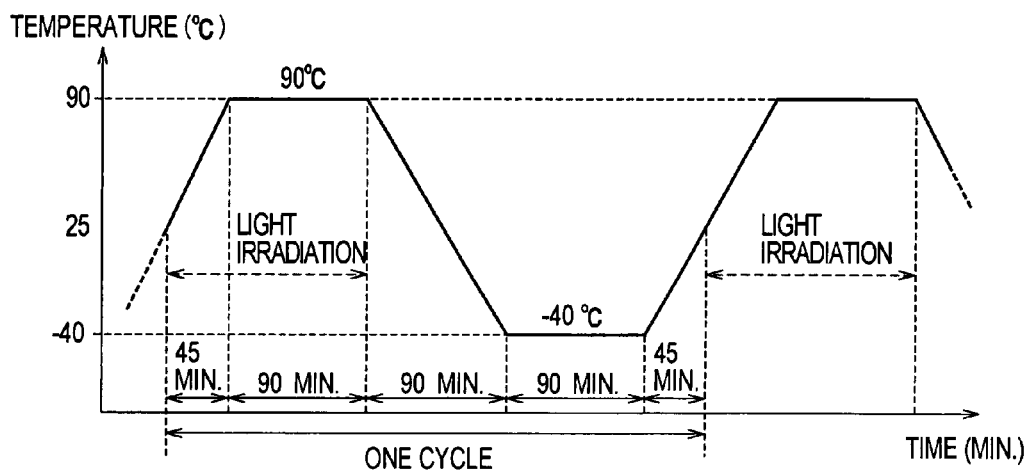
FIG. 12 is a graph of a temperature condition in a temperature cycle test.

Note that the cycle test was performed in conformity with the temperature cycle test of JIS C 8917. FIG. 12 is a graph showing a change of the temperature condition that was programmed in a controller of the temperature-controlled bath. To be more precise, while each of the sample modules was being held inside the temperature-controlled bath, firstly the temperature was increased from 25° C. to 90° C. by taking 45 minutes, secondly the upper limit temperature was maintained for 90 minutes, thirdly the temperature was decreased up to −40° C. by taking 90 minutes, fourthly the lower limit temperature was maintained for 90 minutes, and fifthly the temperature was increased up to 25° C. by taking 45 minutes, as shown in FIG. 12. One cycle (6 hours) consists of these five time periods. This temperature cycle test was performed by repeating the above cycle up to 200 cycles. Thereafter, the adhesive force of the protective member on the back surface side was measured. Note that, in this embodiment, the temperature cycle test was performed by increasing the number of cycles up to 600 cycles in order to study influence of the change of temperature in more detail, although 200 cycles were defined as usual cycles in this temperature cycle test.

TABLE 3

ADHESIVE STRENGTH BETWEEN EVA RESIN AND ITO/GLASS SUBSTRATE

| | LIGHT RECEIVING SIDE | BACK SURFACE SIDE | POWER RATIO |
|---|---|---|---|
| EXAMPLE | EVA-1 | EVA-3 | 98% |
| COMPARATIVE EXAMPLE 1 | EVA-3 | EVA-3 | 96% |
| COMPARATIVE EXAMPLE 2 | EVA-3 | EVA-1 | 96% |

As shown in Table 3, it was found that the power ratio of the module of this example of the present invention is the highest after the temperature cycle test.

In contrast, any of the comparative examples 1 and 2 was able to obtain only the lower power ratio than the example. Here, in the case of the comparative example 1, the sealing materials with the same adhesive force were used for forming the sealing materials on the light receiving surface side and the back surface side of the solar cell, and in the case of the comparative example 2, the sealing material with the larger adhesive force than that of the sealing material on the back surface side was used for forming the sealing material on the light receiving surface side.

From the forgoing result, it was found that it is possible to provide a photovoltaic module that achieves a reduction in adverse influence of damage accumulated in a collector electrode, by making the adhesive force of a sealing material on the light receiving surface side to a solar cell smaller than that of a sealing material on the back surface side to the solar cell.

What is claimed is:

1. A photovoltaic module comprising a light receiving surface side supporting member, a sealing material, a solar cell sealed in the sealing material, and a back surface side supporting member, wherein
   the sealing material includes a first region that is in contact with a light receiving surface of the solar cell, and a second region that is in contact with a back surface of the solar cell, and
   an adhesive force of the first region to the solar cell is smaller than an adhesive force of the second region to the solar cell,
   wherein the sealing material of the first region is selected from ethylene vinyl acetate, polyvinyl butyral, silicone resin, urethane resin, acrylic resin, fluoro-carbon based resin, ionomer resin, silane denatured resin, ethylene-acrylic acid copolymer, ethylene-methacrylic acid copolymer, polyethylene-based resin, polypropylene-based resin, acid-denatured polyolefin-based resin and epoxy-based resin.

2. A photovoltaic module comprising a light receiving surface side supporting member, a sealing material, a solar cell sealed in the sealing material, and a back surface side supporting member, wherein
   the sealing material includes a first region that is in contact with a light receiving surface of the solar cell, and a second region that is in contact with a back surface of the solar cell,
   the first region and the second region contain a same resin material for sealing, and an additive agent for increasing an adhesive force to the solar cell,
   an amount of the additive agent contained in the first region is smaller than an amount of the additive agent contained in the second region, and
   the adhesive force of the first region of the sealing material to the solar cell is smaller than that of the second region of the sealing material to the solar cell.

3. The photovoltaic module according to claim 2, wherein the additive agent is a silane coupling agent.

4. A photovoltaic module comprising a light receiving surface side supporting member, a sealing material, a solar cell sealed in the sealing material, and a back surface side supporting member, wherein
   the sealing material includes a first region that is in contact with a light receiving surface of the solar cell, and a second region that is in contact with a back surface of the solar cell, and
   the back surface of the solar cell is coated with a base coating agent for increasing an adhesive force to the second region.

* * * * *